US009812804B2

(12) United States Patent
Hsu et al.

(10) Patent No.: US 9,812,804 B2
(45) Date of Patent: Nov. 7, 2017

(54) POGO-PINS FOR HIGH SPEED SIGNALING

(71) Applicant: Intel Corporation, Santa Clara, CA (US)

(72) Inventors: Hao-Han Hsu, Portland, OR (US); Yun Ling, Portland, OR (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 304 days.

(21) Appl. No.: 14/227,009

(22) Filed: Mar. 27, 2014

(65) Prior Publication Data

US 2015/0280343 A1 Oct. 1, 2015

(51) Int. Cl.

| | |
|---|---|
| ***G01R 31/20*** | (2006.01) |
| ***H01R 13/24*** | (2006.01) |
| ***H01R 13/6583*** | (2011.01) |
| *H01R 12/72* | (2011.01) |
| *H01R 13/453* | (2006.01) |

(52) U.S. Cl.
CPC ..... *H01R 13/2421* (2013.01); *H01R 13/6583* (2013.01); *H01R 12/724* (2013.01); *H01R 13/4538* (2013.01); *H01R 2201/06* (2013.01); *Y10T 29/49222* (2015.01)

(58) Field of Classification Search
CPC .......... G01R 31/2889; G01R 31/31905; G01R 31/2887; G01R 1/07378; G01R 1/06722; G01R 1/04; Y10T 29/49204; H01R 13/2421; H01R 13/6581; H01R 43/16
USPC ....................... 324/754.07, 500, 537, 754.03
See application file for complete search history.

(56) References Cited

U.S. PATENT DOCUMENTS

| | | | | |
|---|---|---|---|---|
| 5,014,160 A * | 5/1991 | McCoy, Jr. | H05K 3/308 | 174/363 |
| 5,447,442 A * | 9/1995 | Swart | G01R 1/07307 | 347/50 |
| 5,751,546 A * | 5/1998 | Clark | G06F 1/1616 | 361/679.43 |
| 6,049,453 A * | 4/2000 | Hulsebosch | G06F 1/1632 | 361/679.41 |
| 6,114,849 A * | 9/2000 | Price | G01N 27/9033 | 324/219 |
| 6,676,438 B2 * | 1/2004 | Zhou | G01R 1/06711 | 324/756.03 |
| 6,677,245 B2 * | 1/2004 | Zhou | G01R 1/06733 | 257/E23.021 |
| 6,917,102 B2 * | 7/2005 | Zhou | G01R 1/07378 | 257/690 |
| 7,455,532 B2 * | 11/2008 | Laitinen | H01R 13/6658 | 361/734 |
| 8,337,256 B1 * | 12/2012 | Lin | 439/700 | |
| 2004/0023058 A1 * | 2/2004 | Kovacs | H01L 23/26 | 428/626 |
| 2004/0029409 A1 * | 2/2004 | Moon | H01R 12/716 | 439/65 |

(Continued)

*Primary Examiner* — Giovanni Astacio-Oquendo
(74) *Attorney, Agent, or Firm* — Trop Pruner & Hu, P.C.

(57) ABSTRACT

In accordance with some embodiments, a high speed connection may be implemented using pogo-pins. The use of pogo-pins may be advantageous because accurate alignment is not required, connection force is generally lower than with other connections and appearance is often highly advantageous. Through the use of a moveable metal shield, an advantageous high speed connection for high speed signaling may be implemented between the two devices.

18 Claims, 5 Drawing Sheets

(56) References Cited

U.S. PATENT DOCUMENTS

| | | | | |
|---|---|---|---|---|
| 2006/0109018 | A1* | 5/2006 | Bischof | G01R 1/0466 324/756.02 |
| 2007/0229099 | A1* | 10/2007 | Campbell | G01R 1/06755 324/755.01 |
| 2008/0188125 | A1* | 8/2008 | Horiuchi | H01R 13/6485 439/607.01 |
| 2008/0199980 | A1* | 8/2008 | Okayama | G01R 35/00 438/16 |
| 2009/0011644 | A1* | 1/2009 | Amleshi | H01R 13/514 439/607.05 |
| 2011/0091051 | A1* | 4/2011 | Thomason | G06F 1/1616 381/103 |
| 2011/0195598 | A1* | 8/2011 | Panella | H04L 41/12 439/488 |
| 2011/0261551 | A1* | 10/2011 | Chirila | G06K 7/10168 361/818 |
| 2013/0288081 | A1* | 10/2013 | Cheng | H01M 2/204 429/7 |
| 2015/0056870 | A1* | 2/2015 | Chen | H01R 13/2421 439/700 |

* cited by examiner

POGO-PINS FOR HIGH SPEED SIGNALING

BACKGROUND

This relates generally to connectors to connect two electronic devices to receive high speed signals.

Pogo-pins are an advantageous connector for docking two electrical systems. They may enrich user experience in many applications, such as connecting a detachable ultrabook computer to a docking station, because the attaching and detaching process is easier and more convenient. Accurate alignment between the two connectors is not necessary and less force may be needed. The pogo-pin connector may have better appearance and is therefore preferable in many cases.

However pogo-pins have been investigated by various manufacturers and have generally not been adopted for high speed signaling applications due to uncontrollable electromagnetic interference and high frequency interference issues when high speed differential signals are passing through the pogo-pins. This is because the pogo-pin is exposed and therefore is prone to radiate high speed signals. Attempts have been made to add conventional metal shields to pogo-pins used in connection with universal serial bus (USB) and High-Definition Multimedia Interface (HDMI) connectors. However these shields have required high mating force and accurate alignment. These designs also have an undesirable appearance, such that the provision of the shielding neutralized the benefits of pogo-pins and rendered pogo-pins undesirable for high speed signaling.

BRIEF DESCRIPTION OF THE DRAWINGS

Some embodiments are described with respect to the following figures.

DETAILED DESCRIPTION

In accordance with some embodiments, a high speed connection may be implemented using pogo-pins. The use of pogo-pins may be advantageous because accurate alignment is not required, connection force is generally lower than with other connections and appearance is often highly advantageous. Through the use of a moveable metal shield, an advantageous high speed connection for high speed signaling may be implemented between the two devices.

Figure 1:
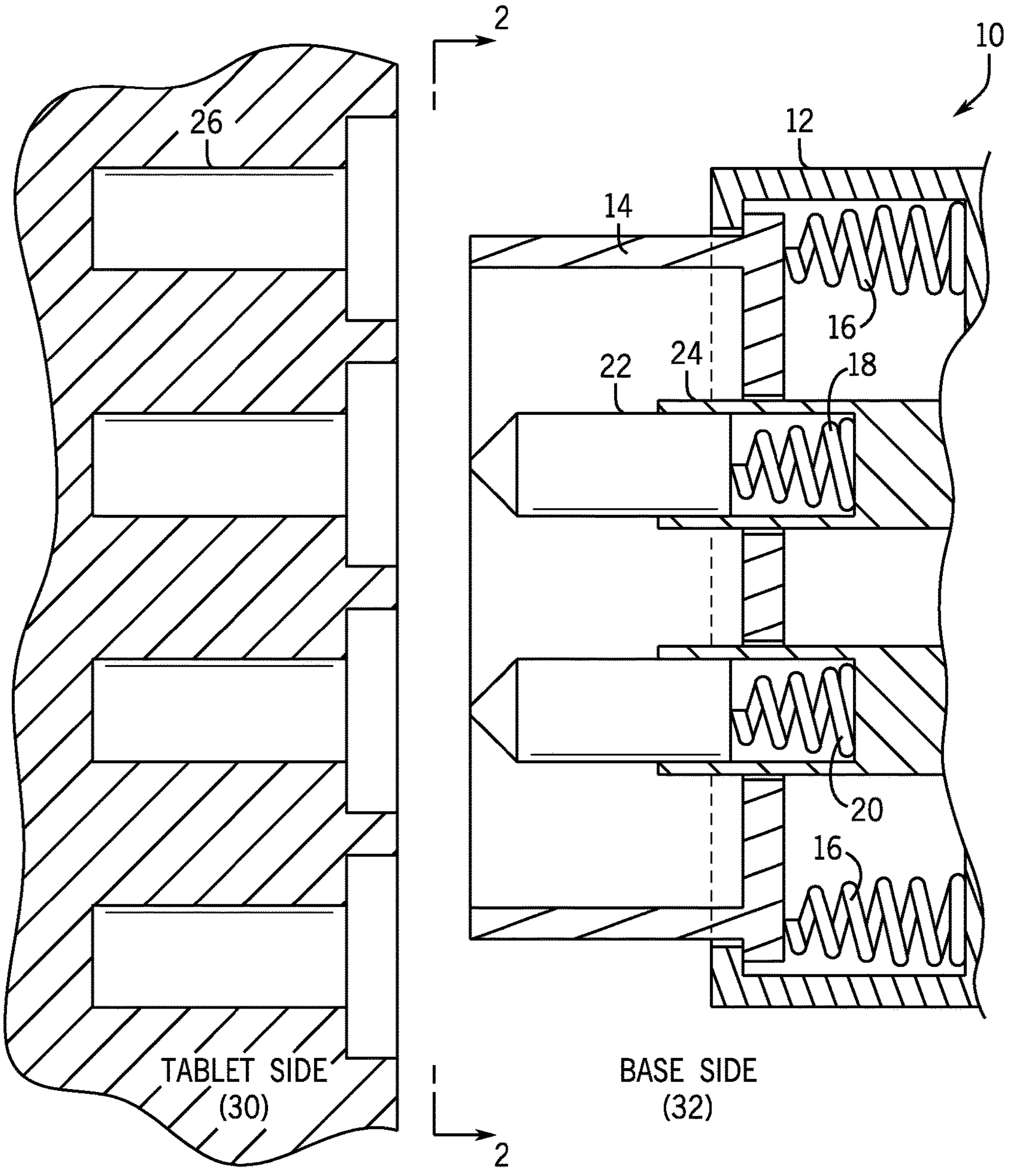
FIG. 1 is an enlarged cross-sectional view of one embodiment of the present invention prior to connection between a tablet and a docking base.

Referring to FIG. 1, a pogo-pin connection between two electrical devices may be implemented in a way that enables high speed signaling. In one application, a tablet side 30 may be connected to a docking base side 32. Thus one conventional application may be for docking stations used by tablet-type computers. However, a large variety of pogo-pin connections between any two electrical devices may be implemented using the techniques described herein.

Other examples of high speed docking applications include docking cellular telephones to other computer systems, docking game devices to computer systems and docking portable testing devices and scanners to computer systems.

Referring to FIG. 1, the tablet or docking station side 30 includes a T-shaped land 26. It receives electrical signals from the base side 32 upon contact. The base side 32 includes a stationary shell 12, a moveable shell 14 and pogo-pins 22. Each of the pogo-pins are mounted on a spring 18 for reciprocal in and out motion within a guide 24. In some embodiments the guide 24 may be shaped to allow telescoping movement of the pogo-pin portion 22. The pogo-pin position 22 may have a relatively pointed distal end for low resistance contact with the T-shaped land 26. Each pogo-pin portion 22 is electrically connected through the spring 20 to a high speed differential pair D+ and D− to enable high speed differential signaling.

Likewise, each end of the moveable shell 14 is connected by a spring 16 to a ground electrical connection. As a result, the conductive moveable shield 14 is grounded. It provides electromagnetic and radio frequency interference shielding of the pogo-pins that may carry high speed signals including differential signals in some embodiments.

Thus an overall shielded connector 10 may have the advantages of pogo-pin connections with reduced electromagnetic and radio frequency interference.

Figure 2:
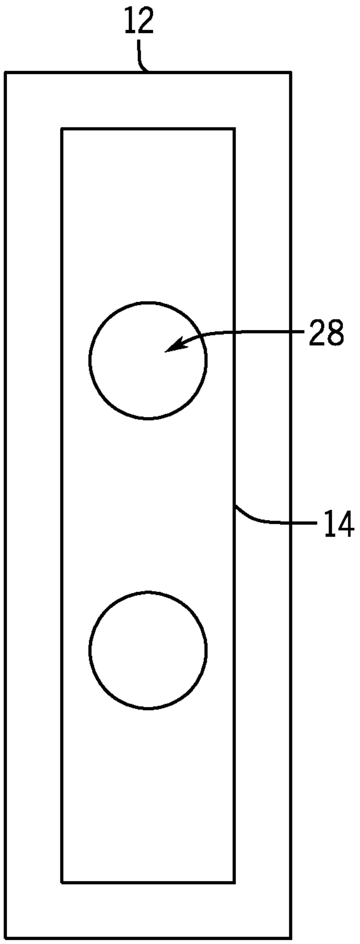
FIG. 2 is a cross-sectional view taken generally along the line 2-2 in FIG. 1.

As shown in FIG. 2, the moveable shell 14 may have openings in one embodiment 28 to allow the pogo-pins to make electrical contact with the tablet side 30 contacts 26.

Figure 3:
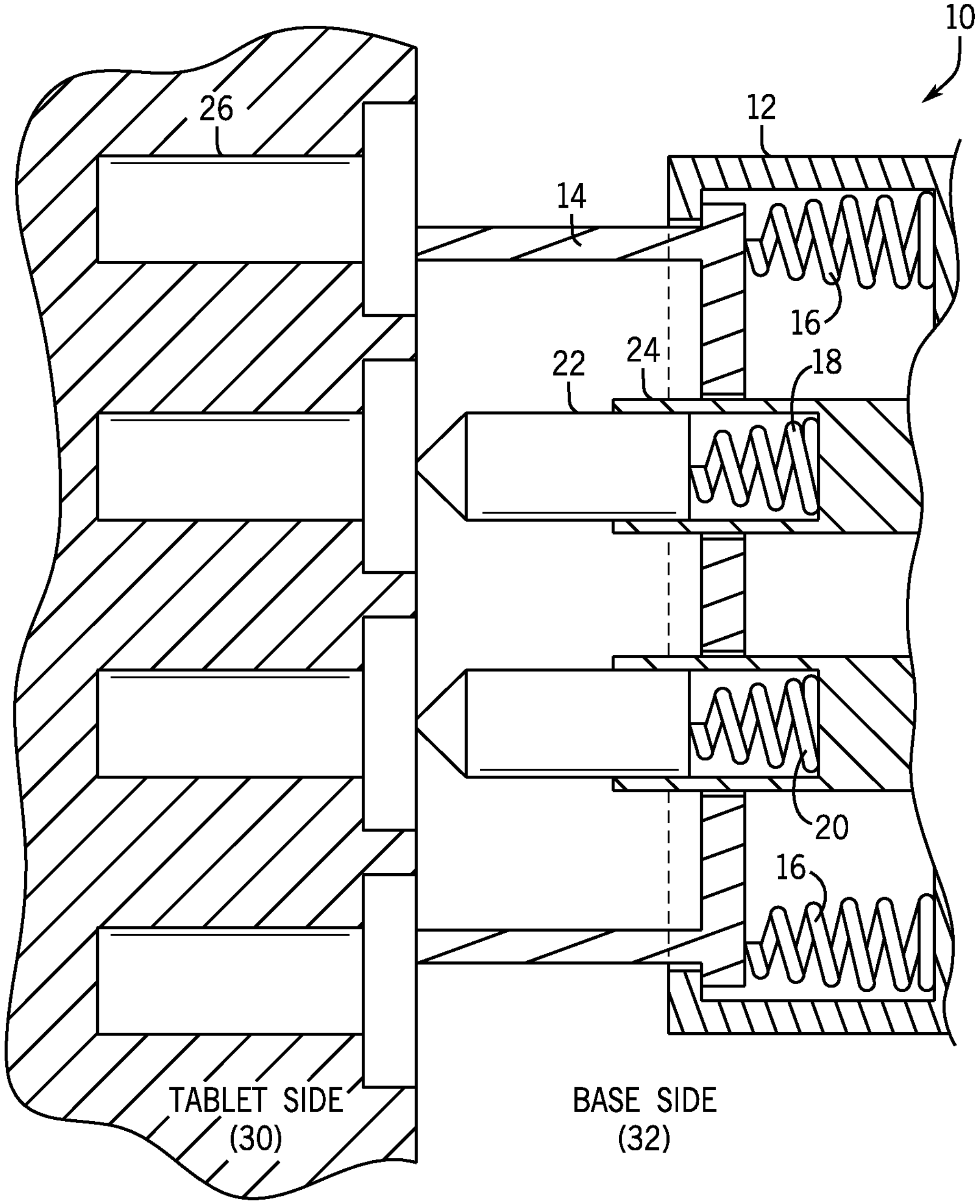
FIG. 3 is a depiction of a connection between a docking base station and a tablet according to one embodiment.

This is better shown in FIG. 3 wherein the moveable shield 14 makes electrical contact with the upper and lower contacts 26 while the pogo-pin portions 22 make electrical contact with the intermediate stationary contacts 26*b* and 22*c*. This allows the differential pair of high speed signals to be passed through the pogo-pins 22 via the housing 24 and/or spring 18 to the contacts 22*b* and 22*c* while fully shielded by the surrounding metallic conductive shield 14, which is grounded. The pins are isolated from the shield 14 by gaps between the pins 22 and the shield 14. The shield 14 is spring biased by the spring 16 against the contacts 26*a* and 26*d*.

If the user provides extra biasing of the base side 32 against the tablet side 30 this is simply absorbed by the spring mounting between the shield 14 and the base side non-moveable housing 12. This is done while maintaining electrical connection between the springs 16, 18, and 20 with the respective differential pair signals D+ and D− and ground.

In some embodiments, the shell 14 may be rectangular as depicted and in other embodiments it may have a more oval or even cylindrical shape. Other shapes may also be used.

Thus in some embodiments radio frequency interference may be reduced while retaining the benefits of pogo-pins including a better user experience. The pogo shield 14 is independently moveable with respect to the pogo-pins. Thus no additional alignment and mating difficulties result from the use of the pogo-pins 14 in some embodiments. Since the pins and shells are independent, good contact can be achieved for all pins and shells even if mechanical attachment between the table and base is not absolutely stable.

In some embodiments scalability may be achieved. It may be difficult and costly to change the pin count of conventional connectors because new tooling may be needed. On the other hand in some embodiments, each pogo-pin may be fabricated individually and connectors are assembled with many individual pogo-pins. Therefore, the pogo-pin of the pogo-pin connector can be adjusted with reasonable cost in some embodiments. For interference from high speed signals, conventional shielding and a ground shell for the whole connector may be used but this sacrifices the scalability of pogo-pins. In some embodiments, individual shielding for each differential pair preserves scalability.

In some embodiments, crosstalk may be reduced. Crosstalk becomes a significant issue as the speed of the signal becomes higher while the pitch and dimension of the connector becomes smaller. In some embodiments, each differential pair has its own shielding to implement 360° shielding with respect to proximate differential pairs. This may reduce crosstalk and increase isolation.

One reason that manufacturers have refrained from using pogo-pins is the radio frequency interference. Because conventional pogo-pins may be exposed and lack shielding, they are prone to radiate high speed signals (such as USB3), causing performance degradation or disconnection of a radio such as WiFi, Global Positioning System (GPS), and Long Term Evolution (LTE)/3G. Because of the use of the pogo-pin shell 14, electromagnetic energy is largely confined within the shell. Therefore a radio can be free from interference and performance degradation in some embodiments.

Thus in some embodiments, two ground pins can be used for one pogo shield 14. The shield may be a metal tube connected to ground. Unlike two point shielding in conventional pogo-pins, the two signal pins are inside the moveable pogo shield to form a 360° shield. When a tablet and base are attached, the pogo shield may be touching the ground pins on the tablet side, forming a continuous return current path. This may reduce electromagnetic interference (EMI) and radio frequency interference (RFI) problems in conventional pogo-pins and may enable use of pogo-pins in mobile devices. The shield is mechanically supported by springs in one embodiment and therefore can move back and forth independently of the signal pins. This ensures that both the signal pins and the ground have good electrical contact. In cases where many small pogo shells are not preferred, a large pogo shell that covers all the pins can be used.

In accordance with another embodiment, instead of solely covering one differential pair of pogo pins, an entire line or two dimensional array of rows and columns of pogo pins may be covered. While FIGS. 4-6 show a line of pogo pins, more than one line may be covered using a similar arrangement in other embodiments.

Figure 4:
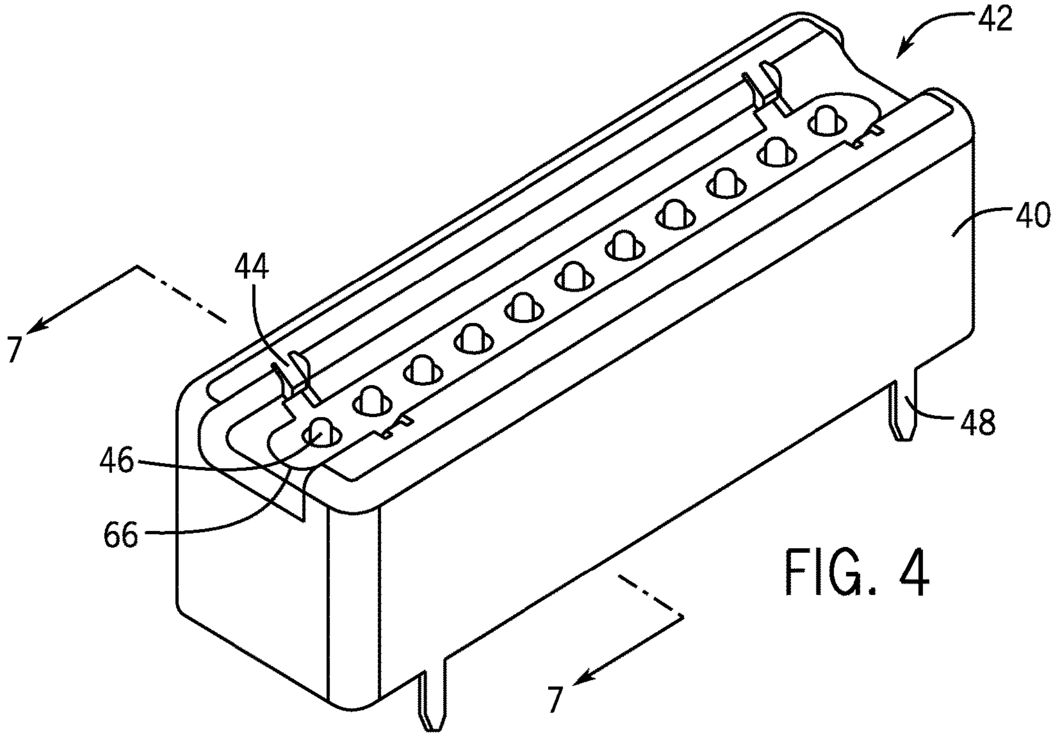
FIG. 4 is a perspective view of a shell on the base side 32 in accordance with another embodiment.

Thus referring to FIG. 4, the plug on the base side includes a metal or conductive shell 40 that covers the pogo pins 46 protruding through the shell in order to make contact with the receptacle. The plug includes prongs 48 for making an electrical and mechanical connection to a printed circuit board associated with a docking station for example.

The plug also includes a shallow U-shaped recess 42 extending along its length, punctuated by the protruding pogo pins 46. The recess 42 provides further radiation protection when the docking station is connected to a tablet. In the illustrated embodiments, the two opposed lengthwise ends are open, for improved manufacturability. However, they may be closed in other embodiments for improved shielding.

Figure 5:
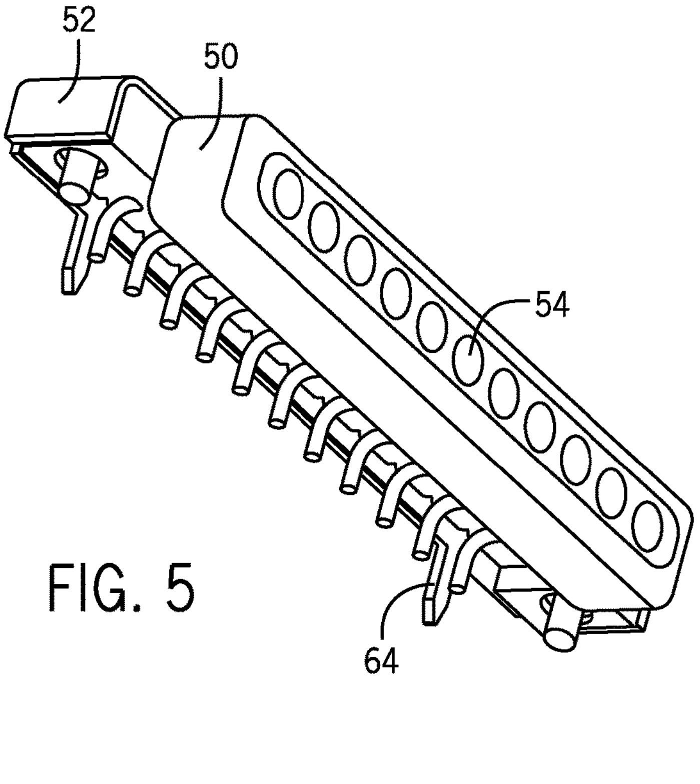
FIG. 5 is a depiction of a receptacle on the tablet side 30 according to the another embodiment.
Figure 6:
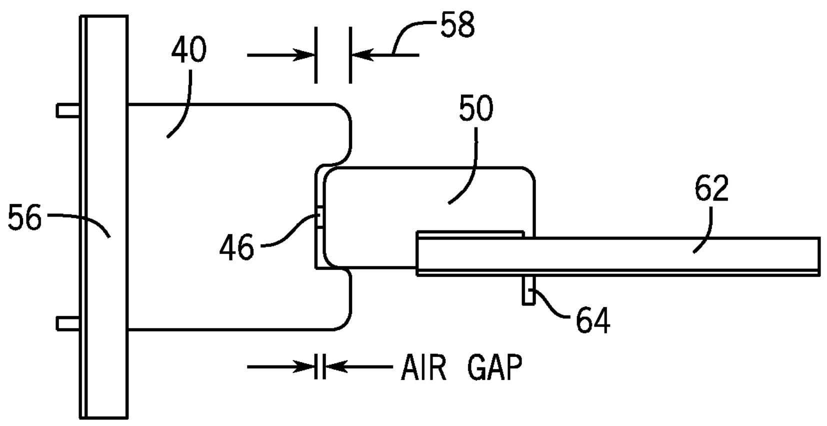
FIG. 6 is a side elevational view of the plug and receptacle in position according to the another embodiment.

Referring to FIG. 5, the receptacle 52 on the tablet includes a metal or conductive shell 50 that provides openings 54 for pogo pins to pass inwardly into the shell 50 to make electrical contact there within. Prongs 64 provide for mechanical and electrical connector to the tablet.

As shown in FIG. 6, when the shell 40 is mounted on the base side, which may include a printed circuit 56, the prongs 48 engage the printed circuit board 56 of the docking station. Similarly the receptacle 52 has prongs 64 that engage a printed circuit board 62 on the tablet. When the receptacle 52 has received the plug, the pogo pins 46 pass outwardly of the shell 40, passing through the openings 54 in the receptacle 50, thereby making electrical contact therewith. Electrical contact between the shell 40 and shell 50 is ensured by the spring contacts 44 on the shell 40. In some cases, the shells 40 and 50 may be grounded to each circuit board 56 or 62.

An air gap as indicated in FIG. 6 exists between the shells 50 and 40. Because of the presence of the recess 42 in the upper surface of the shell 40, indicated at 58 in FIG. 6, additional electromagnetic and radio frequency interference shielding is provided by the recess 42 for the exposed pins 46 in some embodiments.

Figure 7:
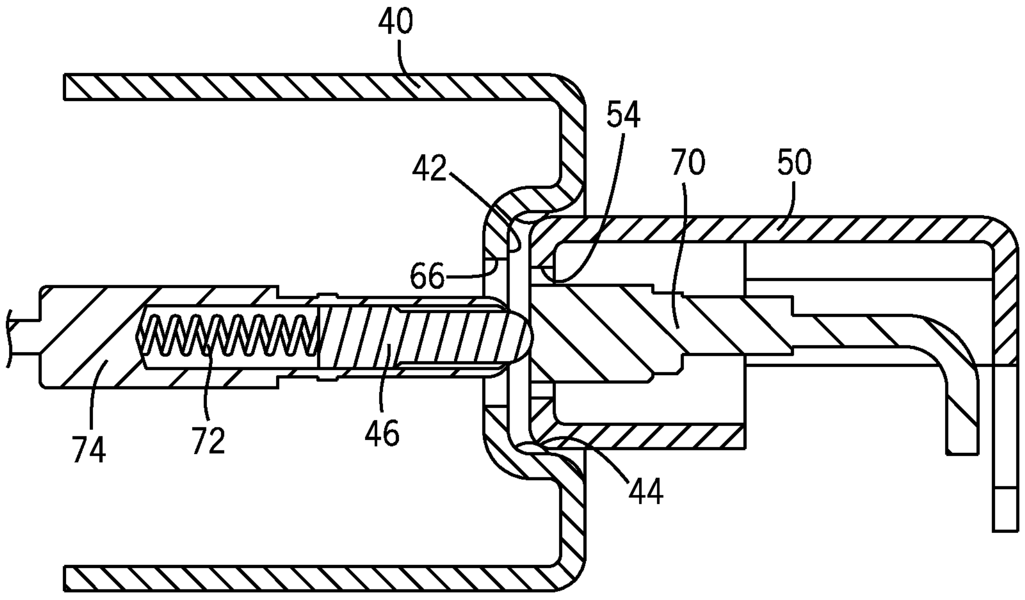
FIG. 7 is an enlarged, partial cross-section taken generally along the lines 7-7 in FIG. 4 when the plug is inserted in the receptacle.

FIG. 7 shows the internal configuration of the two devices when connected. Namely when the plug is mechanically and electrically engaged with the receptacle, as shown in FIG. 6, the springs 44 connect the shells 40 and 50 electrically. The pins 46 extend through an opening 66 in the shell 40 and contact the contacts 70 on the shell 50.

The pins 46 are part of the pogo pin that includes a housing 74. The pin 46 reciprocates telescopically within the housing, biased outwardly by the coil spring 72.

The recess or depression 42 serves to protect the air gap between the two devices at least along a vertical direction. In some embodiments, recessed end walls may be included as well along the ends of the shell 40 on opposite ends in the direction of the length of the shell 40 in order to protect or shield in the horizontal direction as well. The use of an air gap improves manufacturability in some embodiments.

The following clauses and/or examples pertain to further embodiments:

One example embodiment may be an apparatus comprising a stationary housing, a pogo-pin mounted in said housing and an open, moveable electromagnetic shield completely surrounding said pogo-pin and mounted on said housing for reciprocation towards and away from said housing. The apparatus may include a pair of pogo-pins mounted on said housing, each pogo-pin connected to a different one of two signals of a differential pair. The apparatus wherein said pogo-pins are coupled to said housing by a pair of spring contacts. The apparatus wherein said shield is coupled to ground. The apparatus wherein said shield is coupled to ground at two different places. The apparatus wherein said shield is coupled to said housing by spring contacts. The apparatus wherein said pogo-pin including a sleeve and a conductive pin mounted on a spring, said pin reciprocateable within said sleeve for telescoping motion. The apparatus wherein said sleeve is coupled to receive one signal of a differential pair. The apparatus may include said pogo-pin to make contact with another device through an open end. The apparatus wherein said apparatus is a docking station.

Another example embodiment may be a method comprising providing a conductive shield around a differential pair of pogo pins, said shield completely surrounding said pogo pin pair, and mounting said shield for reciprocation towards and away from a stationary housing. The method may include connecting each one of said pogo pin pair to a different one of two differential signals. The method may include coupling said pogo pins to said housing by a pair of spring contacts. The method may include coupling said shield to ground. The method may include coupling said shield to ground at two different places. The method may include coupling said shield to said housing by spring contacts. The method may include providing said pogo pins with a sleeve and a conductive pin mounted on a spring, said pin reciprocal within said sleeve for telescoping motion. The method may include coupling said sleeve to receive one signal of a differential signal pair. The method may include providing pogo pins that make contact with another device through an open end.

In another example embodiment may be an apparatus comprising a plurality of pogo pins, a conductive shield surrounding said pogo pins, openings in said shield for the passage of said pogo pins through said shield, and a depression in said shield, said pins passing through said depression so that said shield covers said pins wherein they pass out of said shield on two opposed sides of said pins. The apparatus may include a spring contact on said housing. The apparatus where said apparatus is a docking station. The apparatus may include a receptacle in contact with said pogo pins. The apparatus may include a tablet, said receptacle being part of said tablet. The apparatus may include a second conductive shield over said receptacle, said second conductive shield having openings to receive said pins.

Another example embodiment may be a method comprising surrounding a plurality of pogo pins with a first conductive shield, and providing a recess in an end of said shield, said end having at least one opening for the passage of said pogo pins. The method may include providing a second conductive shield around a receptacle that contacts said pogo pins. The method may include connecting said pogo pins to a docking station and connecting said docking station to a tablet through said pogo pins. The method may include providing a receptacle on said tablet to contact said pogo pins and covering said receptacle with said second conductive shield. The method may include electrically connecting said conductive shields.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While a limited number of embodiments have been described, those skilled in the art will appreciate numerous modifications and variations therefrom. It is intended that the appended claims cover all such modifications and variations as fall within the true spirit and scope of this disclosure.

What is claimed is:

1. An apparatus comprising:

a first component including a contact surface;

a second component including a housing;

a pogo-pin mounted in said housing to make resilient electrical contact with said first component via said contact surface; and a conductive electromagnetic shield completely surrounding said pogo-pin when making resilient electrical contact with said contact surface and mounted on said housing for telescoping reciprocation into and out of said housing, said shield having an opening that, when resilient electrical contact is made with said surface, contacts said surface to complete an enclosure that completely surrounds said pogo pin, said enclosure including said contact surface, said housing and said shield, such that a totally shielded electrical connection is made between said first and second components.

2. The apparatus of claim 1 including a pair of pogo-pins mounted on said housing, each pogo-pin connected to a different one of two signals of a differential pair.

3. The apparatus of claim 2 wherein said pogo-pins are coupled to said housing by a pair of spring contacts.

4. The apparatus of claim 2 wherein said pogo-pin including a sleeve and a conductive pin mounted on a spring, said pin reciprocateable within said sleeve for telescoping motion.

5. The apparatus of claim 4 wherein said sleeve is coupled to receive one signal of a differential pair.

6. The apparatus of claim 1 wherein said shield is coupled to ground.

7. The apparatus of claim 6 wherein said shield is coupled to ground at two different places.

8. The apparatus of claim 6 wherein said shield is coupled to said housing by spring contacts.

9. The apparatus of claim 1 said pogo-pin to make contact with another device through an open end.

10. The apparatus of claim 1 wherein said apparatus is a docking station.

11. A method comprising:

providing a first component including a contact surface;

providing a second component including a housing;

mounting a pogo-pin mounted in said housing to make resilient electrical contact with said first component via said contact surface;

providing a conductive electromagnetic shield around the pogo-pin, said shield completely surrounding said pogo-pin when making resilient electrical contact with a first component via said contact surface and said shield mounted on a second component including stationary housing for telescoping reciprocation into and out of said contact surface, said shield having an opening that, when resilient electrical contact is made with said contact surface, completes an enclosure that completely surrounds said pogo-pin, said enclosure including said contact surface, said stationary housing and said shield, such that a totally shielded electrical connection is made between said first and second components with a stationary housing; and mounting said shield for reciprocation into and out of the stationary housing.

12. The method of claim 11 including connecting each one of a pogo-pin pair to a different one of two differential signals.

13. The method of claim 12 including coupling said pogo-pins to said housing by a pair of spring contacts.

14. The method of claim 12 including providing said pogo-pins with a sleeve and a conductive pin mounted on a spring, said pin reciprocal within said sleeve for telescoping motion.

15. The method of claim 14 including coupling said sleeve to receive one signal of a differential signal pair.

16. The method of claim 11 including coupling said shield to ground.

17. The method of claim 16 including coupling said shield to ground at two different places.

18. The method of claim 16 including coupling said shield to said housing by spring contacts.

* * * * *